United States Patent
Kang et al.

(10) Patent No.: US 9,459,495 B2
(45) Date of Patent: Oct. 4, 2016

(54) LIQUID CRYSTAL DISPLAY AND METHOD OF MANUFACTURING THE SAME

(71) Applicant: Samsung Display Co., Ltd., Yongin (KR)

(72) Inventors: Suk Hoon Kang, Seoul (KR); Yeong Rong Park, Suwon-si (KR); Sang Hee Yu, Yongin-si (KR); Mi Hwa Lee, Seoul (KR); Jun Woo Lee, Seongnam-si (KR); Baek Kyun Jeon, Yongin-si (KR); Pil Ho Huh, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 18 days.

(21) Appl. No.: 14/298,179

(22) Filed: Jun. 6, 2014

(65) Prior Publication Data
US 2015/0160515 A1 Jun. 11, 2015

(30) Foreign Application Priority Data

Dec. 10, 2013 (KR) .................... 10-2013-0153338

(51) Int. Cl.
| | | |
|---|---|---|
| *C09K 19/00* | (2006.01) | |
| *G02F 1/1337* | (2006.01) | |
| *H01L 27/12* | (2006.01) | |

(52) U.S. Cl.
CPC ... *G02F 1/133723* (2013.01); *G02F 1/133788* (2013.01); *H01L 27/1259* (2013.01); *Y10T 428/10* (2015.01); *Y10T 428/1023* (2015.01)

(58) Field of Classification Search
CPC .......... G02F 1/1337; G02F 1/133723; G02F 1/133788; G02F 1/134363; Y10T 428/10; Y10T 428/1005; Y10T 428/1023; H01L 27/1259; H01L 21/02118; B32B 2457/202; C09D 179/08; C09D 179/085

USPC .......... 428/1.1, 1.2, 1.26; 349/123, 134, 84; 522/134, 162, 164; 528/350, 353

See application file for complete search history.

(56) References Cited

U.S. PATENT DOCUMENTS

| | | | |
|---|---|---|---|
| 6,063,829 | A | 5/2000 | Endou et al. |
| 7,489,378 | B2 | 2/2009 | Sakai et al. |
| 7,800,720 | B2 | 9/2010 | Tsuchiya et al. |
| 8,025,939 | B2 | 9/2011 | Tomioka et al. |
| 8,085,372 | B2 | 12/2011 | Sonoda et al. |
| 8,351,003 | B2 | 1/2013 | Sonoda et al. |
| 8,432,517 | B2 | 4/2013 | Sonoda et al. |
| 2008/0231786 | A1* | 9/2008 | Shin .............................. 349/124 |
| 2010/0225865 | A1* | 9/2010 | Tomioka et al. ............ 349/123 |
| 2011/0116027 | A1* | 5/2011 | Sonoda et al. ............... 349/123 |

FOREIGN PATENT DOCUMENTS

| | | |
|---|---|---|
| KR | 100738810 | 7/2007 |
| KR | 101043636 | 6/2011 |

\* cited by examiner

*Primary Examiner* — Ruiyun Zhang
(74) *Attorney, Agent, or Firm* — H.C. Park & Associates, PLC

(57) ABSTRACT

Provided is a liquid crystal display that includes: a first substrate; a thin film transistor disposed on the first substrate; a first electrode connected to the thin film transistor; and a first alignment layer disposed on the first electrode. The first alignment layer is formed by polymerizing a diamine and at least one of cyclobutane dianhydride (CBDA) and a cyclobutane dianhydride (CBDA) derivative. A decomposition efficiency representing a change in imidization ratio included before and after light exposure of the first alignment layer is in a range of 10% to 30%.

9 Claims, 14 Drawing Sheets

FIG. 13

| Sample | UVi(J/cm²) | $\frac{A_{1380}}{A_{1500}}$ | average | $R_{imide\ ratio}$ | decomposition | decomposition / imide unit |
|---|---|---|---|---|---|---|
| | | | | | % | |
| Example 1 | 0.0 | 0.64 | 0.66 | 57 | — | — |
| | | 0.68 | | | | |
| | 0.8 | 0.57 | 0.57 | 49 | 8 | 14 |
| | | 0.57 | | | | |
| | 1.0 | 0.54 | 0.55 | 47 | 10 | 17 |
| | | 0.56 | | | | |
| | 1.5 | 0.52 | 0.525 | 45 | 12 | 21 |
| | | 0.53 | | | | |
| | Reference | 1.12 | 1.16 | 100.0 | — | — |
| | | 1.19 | | | | |

LIQUID CRYSTAL DISPLAY AND METHOD OF MANUFACTURING THE SAME

CROSS-REFERENCE TO RELATED APPLICATION

This application claims priority to and the benefit of Korean Patent Application No. 10-2013-0153338, filed on Dec. 10, 2013, which is hereby incorporated by reference for all purposes as if fully set forth herein.

BACKGROUND

1. Field

Exemplary embodiments of the present invention relates to a liquid crystal display and a method of manufacturing the same.

2. Discussion of the Background

In order to implement an image by a liquid crystal display, that is, in order to switch liquid crystals by an external electric field between transparent conductive glasses, the liquid crystals should be aligned in a predetermined direction at an interface between the liquid crystals and a transparent conductive glass electrode. The degree of uniformity of alignment of the liquid crystals is one of the most important factors in determining image quality of a liquid crystal display.

Examples of a known general method of aligning the liquid crystals include a rubbing method of applying a polymer layer such as polyimide on a substrate such as glass, and rubbing a surface in a predetermined direction using fibers such as nylon or polyester. However, when the fibers and the polymer layer are rubbed, fine dust or static electricity may occur, which may cause a serious problem when a liquid crystal panel is manufactured.

In order to solve the aforementioned problem, a photoalignment method where anisotropy is induced on the polymer layer by radiation of light and the liquid crystals are arranged by using anisotropy, has been developed. Examples of a material usable in the photoalignment method include polymers containing a photofunctional group such as azobenzene, cumarine, imide, chalcone, and cinnamate, and in the polymers, a reaction such as photoisomerization, photocrosslinking, and photodecomposition, anisotropically occurs by radiation of polarized light. Thus, anisotropy is caused on the surface of the polymer to arrange the liquid crystals in one direction.

When the liquid crystals are aligned by photodecomposition, the liquid crystals are initially aligned, and then the alignment force is improved to implement more stable alignment, in view of reliability.

The above information disclosed in this Background section is only for enhancement of understanding of the background of the invention and therefore it may contain information that does not form the prior art that is already known in this country to a person of ordinary skill in the art.

SUMMARY

Exemplary embodiments of the present invention provide a liquid crystal display limiting optimum decomposition efficiency of a photodecompositional photoalignment layer, and a method of manufacturing the same.

Additional features of the invention will be set forth in the description which follows, and in part will be apparent from the description, or may be learned by practice of the invention.

An exemplary embodiment of the present invention provides a liquid crystal display including: a first substrate; a thin film transistor disposed on the first substrate; a first electrode connected to the thin film transistor; and a first alignment layer disposed on the first electrode, in which the first alignment layer is formed by polymerizing at least one of cyclobutane dianhydride (CBDA) and a cyclobutane dianhydride (CBDA) derivative, and diamine, and decomposition efficiency representing a change in imidization ratio included before and after exposure of the first alignment layer is 10% or more and 30% or less.

The first alignment layer may be formed by a polymerization reaction of a diamine and at least one of a cyclobutane dianhydride (CBDA) represented by the following Chemical Formula A and a cyclobutane dianhydride (CBDA) derivative represented by the following Chemical Formula B.

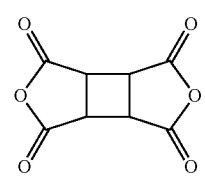

Chemical Formula A

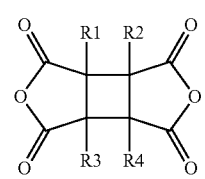

Chemical Formula B

In Chemical Formula B, R1, R2, R3, and R4 are each independently hydrogen, fluorine, or an organic compound, and at least one of R1, R2, R3, and R4 is not hydrogen.

The first alignment layer may include a repeating unit represented by the following Chemical Formula C or D.

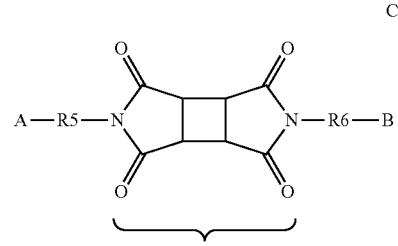

Chemical Formula C

Unit 1

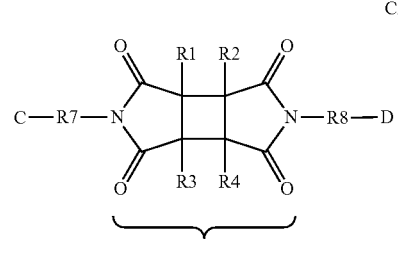

Chemical Formula D

Unit 2

In Chemical Formulas C and D, R5, R6, R7, and R8 are each a group bonded to amines of two adjacent diamines, A, B, C, and D are each unit 1 or unit 2, and in Chemical Formula D, R1, R2, R3, and R4 are each independently hydrogen, fluorine, or an organic compound, and at least one of R1, R2, R3, and R4 is not hydrogen.

Another exemplary embodiment of the present invention provides a liquid crystal display including: a first substrate; a thin film transistor disposed on the first substrate; a first electrode connected to the thin film transistor; and a first alignment layer disposed on the first electrode, in which the first alignment layer may be formed by polymerizing at least one of cyclobutane dianhydride (CBDA) and a cyclobutane dianhydride (CBDA) derivative, and diamine, and decomposition efficiency/unit of the first alignment layer may satisfy a range of the following Equation 1.

$$1000/X(\%) \leq \text{decomposition efficiency/unit} \leq 3000/X(\%) \quad \text{Equation 1}$$

In Equation 1, X is an imidization ratio before exposure.

Yet another exemplary embodiment of the present invention provides a method of manufacturing a liquid crystal display, including: forming a thin film transistor on a first substrate; forming a passivation layer on the thin film transistor; forming a first electrode and a second electrode on the passivation layer while an insulating layer is disposed between the first electrode and the second electrode; applying a photoalignment agent formed by polymerizing at least one of cyclobutane dianhydride (CBDA) and a cyclobutane dianhydride (CBDA) derivative on the first electrode or the second electrode; baking the applied photoalignment agent; and forming a first alignment layer by radiating polarized light on the photoalignment agent, in which when polarized light is radiated on the photoalignment agent, decomposition efficiency of the photoalignment agent is 10% or more and 30% or less.

Still another exemplary embodiment of the present invention provides a method of manufacturing a liquid crystal display, including: forming a thin film transistor on a first substrate; forming a passivation layer on the thin film transistor; forming a first electrode and a second electrode on the passivation layer while an insulating layer is disposed between the first electrode and the second electrode; applying a photoalignment agent formed by polymerizing at least one of cyclobutane dianhydride (CBDA) and a cyclobutane dianhydride (CBDA) derivative on the first electrode or the second electrode; baking the applied photoalignment agent; and forming a first alignment layer by radiating polarized light on the photoalignment agent, in which when the polarized light is radiated on the photoalignment agent, decomposition efficiency/unit of the photoalignment agent satisfies a range of the following Equation 1.

$$1000/X(\%) \leq \text{decomposition efficiency/unit} \leq 3000/X(\%) \quad \text{Equation 1}$$

In Equation 1, X is an imidization ratio before exposure.

According to the exemplary embodiments of the present invention, it is possible to improve anisotropy and an afterimage (reliability) by controlling decomposition efficiency to from 10% to 30%, during a photoreaction, by exposure of a photo-decompositional photoalignment layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the principles of the invention.

FIG. 13 is a table illustrating a change in decomposition efficiency measured by an FT-IR analysis method in Example 1 of the present invention.

DETAILED DESCRIPTION OF THE EMBODIMENTS

Figure 1:
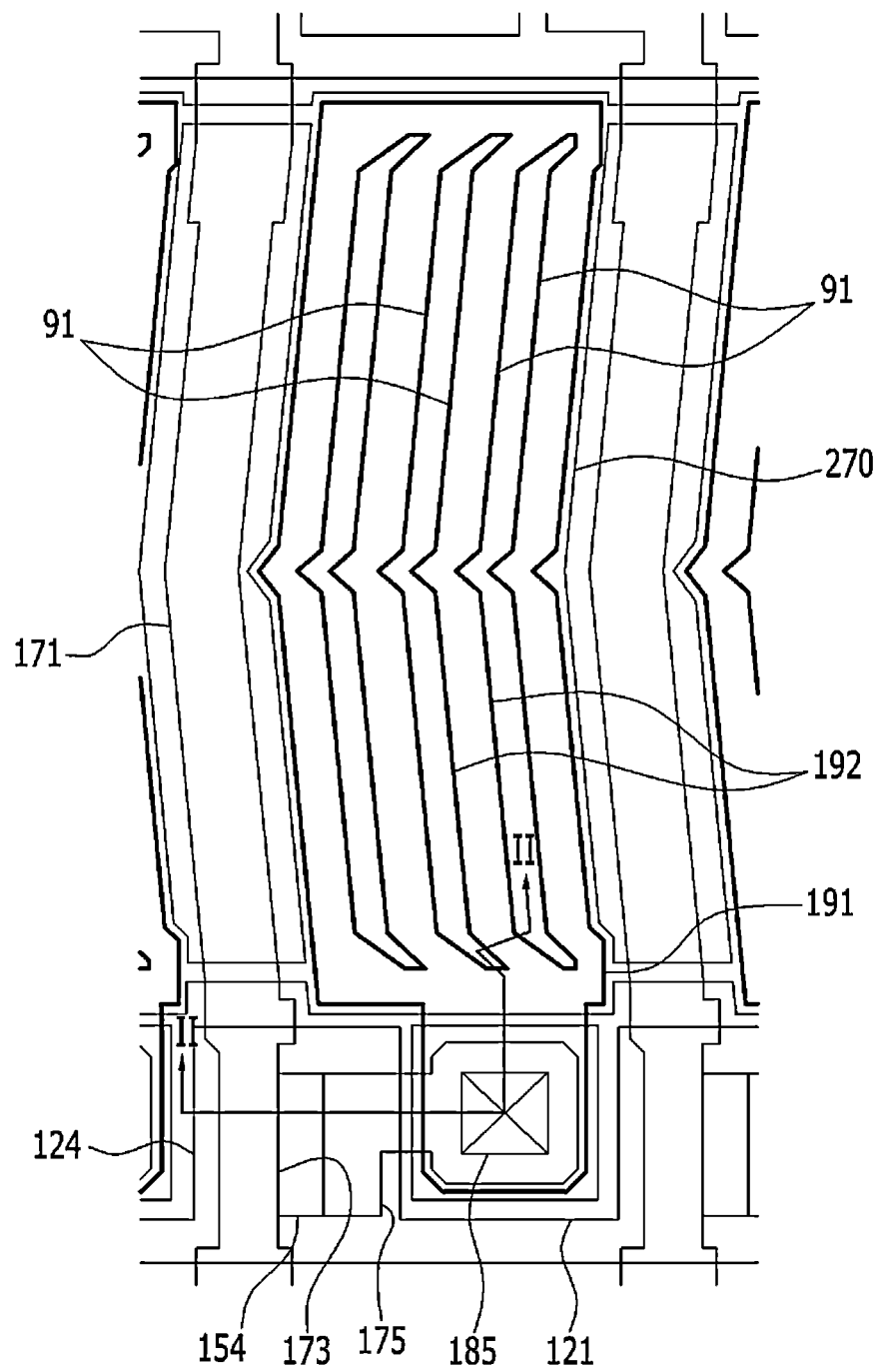
FIG. 1 is a top plan view illustrating a liquid crystal display according to an exemplary embodiment of the present invention.

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these exemplary embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present. It will be understood that for the purposes of this disclosure, "at least one of X, Y, and Z" can be construed as X only, Y only, Z only, or any combination of two or more items X, Y, and Z (e.g., XYZ, XYY, YZ, ZZ).

Figure 2:
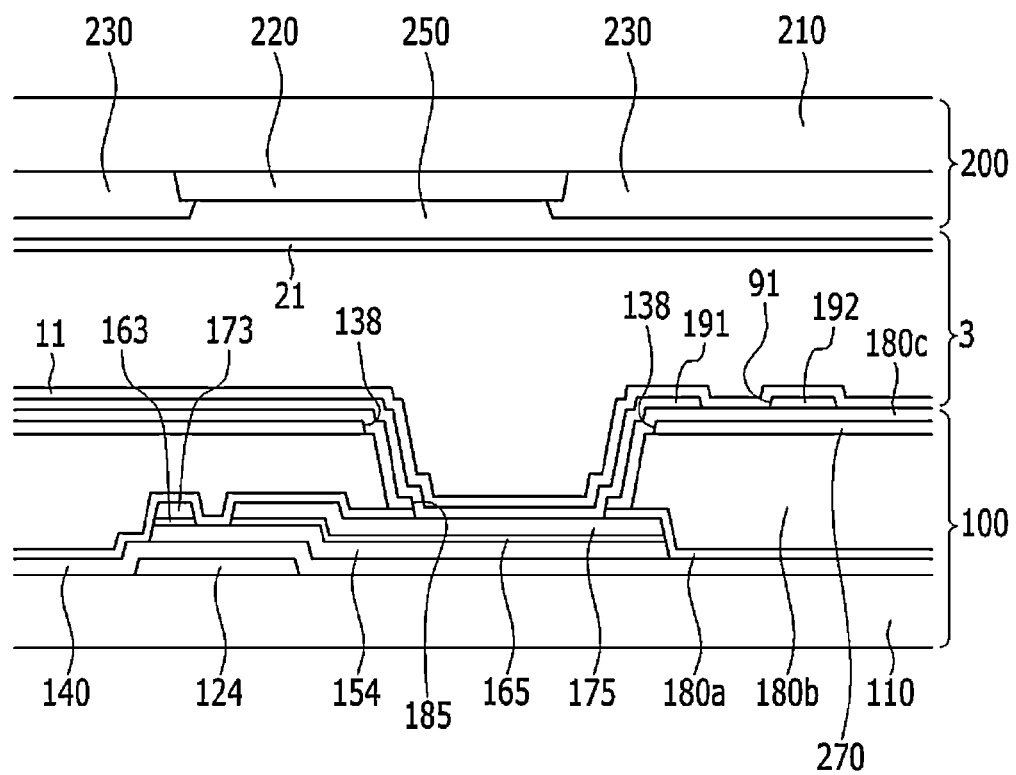
FIG. 2 is a cross-sectional view taken along cut line II-II of FIG. 1.

FIG. 1 is a top plan view illustrating a liquid crystal display according to an exemplary embodiment of the present invention. FIG. 2 is a cross-sectional view taken along cut line II-II of FIG. 1. Referring to FIGS. 1 and 2, the liquid crystal display according to the present exemplary embodiment includes a lower display panel 100 and an upper display panel 200 facing each other, and a liquid crystal layer 3 injected therebetween.

First, the lower display panel 100 will be described. A gate conductor including a gate line 121 is formed on a first substrate 110 formed of transparent glass, plastics, or the like.

The gate line 121 includes a gate electrode 124, and a wide end portion (not shown) for connection with another layer or an external driving circuit. The gate line 121 may be made aluminum (Al) or an aluminum alloy, silver (Ag) or a silver alloy, copper (Cu) or a copper alloy, molybdenum (Mo) or a molybdenum alloy, chromium (Cr), tantalum (Ta), and/or titanium (Ti). However, the gate line 121 may have a multilayered structure including at least two conductive layers having different physical properties.

A gate insulating layer 140, formed of silicon nitride ($SiN_x$), silicon oxide ($SiO_x$), or the like, is formed on the gate line 121. The gate insulating layer 140 may have a multi-layered structure including at least two insulating layers having different physical properties.

A semiconductor layer 154, made of amorphous silicon, polysilicon, or the like, is disposed on the gate insulating layer 140. The semiconductor layer 154 may include an oxide semiconductor.

Ohmic contacts 163 and 165 are formed on the semiconductor layer 154. The ohmic contacts 163 and 165 may be made of a silicide or a material such as n+ hydrogenated amorphous silicon that may be highly doped with an n-type impurity such as phosphorus. The ohmic contacts 163 and 165 may form a pair to be disposed on the semiconductor layer 154. In the case where the semiconductor layer 154 includes the oxide semiconductor, the ohmic contacts 163 and 165 may be omitted.

A data conductor including a data line 171 including a source electrode 173 and a drain electrode 175 is formed on the ohmic contacts 163 and 165, and the gate insulating layer 140. The data line 171 includes a wide end portion (not shown) for connection with another layer or the external driving circuit. The data line 171 transports a data signal and mainly extends in a vertical direction to cross the gate line 121.

The data line 171 may have a bent portion in order to improve transmittance of the liquid crystal display. The bent portions may meet each other in an intermediate region of a pixel region to form a V shape.

The source electrode 173 is a portion of the data line 171, and is disposed on the same line as the data line 171. The drain electrode 175 is formed to extend in parallel to the source electrode 173. Accordingly, the drain electrode 175 is parallel to a portion of the data line 171.

The gate electrode 124, the source electrode 173, and the drain electrode 175 form one thin film transistor (TFT), together with the semiconductor layer 154. A channel of the thin film transistor is formed in the semiconductor layer 154 between the source electrode 173 and the drain electrode 175.

The source electrode 173 may be disposed on the same line as the data line 171 and the drain electrode 175, while extending in parallel to the data line 171 to increase a width of the thin film transistor. Thus, an occupying area of the data conductor is not increased, and an opening ratio of the liquid crystal display may be increased.

The data line 171 and the drain electrode 175 may be made of a refractory metal such as molybdenum, chromium, tantalum, and titanium, or an alloy thereof. The data line 171 and the drain electrode 175 may have a multilayered structure including a refractory metal layer (not shown) and a low resistance conductive layer (not shown). Examples of the multilayered structure may include a double layer of a chromium or molybdenum (alloy) lower layer, and an aluminum (alloy) upper layer, and a triple layer of a molybdenum (alloy) lower layer, an aluminum (alloy) intermediate layer, and a molybdenum (alloy) upper layer.

A first passivation layer 180a is disposed on exposed portions of the data conductors 171, 173, and 175, the gate insulating layer 140, and the semiconductor layer 154. The first passivation layer 180a may be formed of an organic insulating material, an inorganic insulating material, or the like.

A second passivation layer 180b is formed on the first passivation layer 180a. The second passivation layer 180b may be formed of an organic insulator.

The second passivation layer 180b may be a color filter. In the case where the second passivation layer 180b is the color filter, the second passivation layer 180b may intrinsically display any one of primary colors. Examples of the primary colors may include three primary colors such as red, green, or blue, yellow, cyan, magenta, or the like. Although not shown in the drawings, the color filter may further include a color filter displaying a mixed color of the primary colors or white in addition to the primary colors. In the case where the second passivation layer 180b is the color filter, a color filter 230 may be omitted in the upper display panel 200, as will be described later.

A common electrode 270 is disposed on the second passivation layer 180b. The common electrode 270 may have a planar shape, may be formed of an integrated plate on an entire surface of the first substrate 110, and has an opening 138 disposed in a region corresponding to a periphery of the drain electrode 175. That is, the common electrode 270 may have a plate shape. The common electrodes 270 disposed in adjacent pixels may be connected to each other to receive a common voltage supplied from the outside of a display region.

An insulating layer 180c is disposed on the common electrode 270. The insulating layer 180c may be formed of an organic insulating material, an inorganic insulating material, or the like.

A pixel electrode 191 is disposed on the insulating layer 180c. The pixel electrode 191 includes a curved edge that is almost parallel to a first bent portion and a second bent portion of the data line 171. The pixel electrode 191 has a plurality of cutouts 91, and includes a plurality of branch electrodes 192 disposed between the adjacent cutouts 91.

The pixel electrode 191 is a first field generating electrode or a first electrode, and the common electrode 270 is a second field generating electrode or a second electrode. The pixel electrode 191 and the common electrode 270 may form a horizontal electric field.

A first contact hole 185, through which the drain electrode 175 is exposed, is formed through the first passivation layer 180a, the second passivation layer 180b, and the insulating layer 180c. The pixel electrode 191 is physically and electrically connected to the drain electrode 175 through the first contact hole 185, to receive a voltage from the drain electrode 175.

A first alignment layer 11 is formed on the pixel electrode 191 and the insulating layer 180c. The first alignment layer 11 includes a photoreactive material.

In the present exemplary embodiment, the first alignment layer 11 is formed by polymerizing at least one of cyclobutane dianhydride (CBDA) and a cyclobutane dianhydride (CBDA) derivative. Like this, a liquid crystal photoalignment agent formed by polymerizing at least one of cyclobutane dianhydride (CBDA) and the cyclobutane dianhydride (CBDA) derivative is formed by a polymerization reaction of at least one of cyclobutane dianhydride (CBDA) represented by the following Chemical Formula A and the cyclobutane dianhydride (CBDA) derivative represented by the following Chemical Formula B, and a diamine.

Chemical Formula A

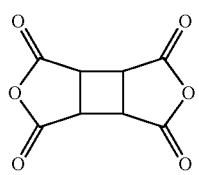

Chemical Formula B

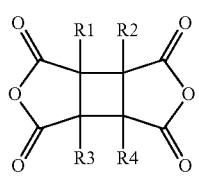

Herein, in Chemical Formula B, R1, R2, R3, and R4 are each independently hydrogen, fluorine, or an organic compound, and at least one of R1, R2, R3, and R4 is not hydrogen.

In the present exemplary embodiment, the diamine may be an aromatic diamine such as p-phenylenediamine, m-phenylenediamine, 2,5-diaminotoluene, 2,6-diaminotoluene, 4,4'-diaminobiphenyl, 3,3'-dimethyl-4,4'-diaminobiphenyl, 3,3'-dimethoxy-4,4'-diaminobiphenyl, diaminodiphenylmethane, diaminodiphenylether, 2,2'-diaminodiphenylpropane, bis(3,5-diethyl-4-aminophenyl)methane, diaminodiphenylsulfone, diaminobenzophenon, diaminonaphthalene, 1,4-bis(4-aminophenoxy)benzene, 1,4-bis(4-aminophenyl)benzene, 9,10-bis(4-aminophenyl)anthracene, 1,3-bis(4-aminophenoxy)benzene, 4,4'-bis(4-aminophenoxy)diphenylsulfone, 2,2-bis[4-(4-aminophenoxyl)phenyl]propane, 2,2-bis(4-aminophenyl)hexafluoropropane, and 2,2-bis[4-(4-aminophenoxy)phenyl]hexafluoropropane, cycloaliphatic diamine such as bis(4-aminocyclohexyl)methane and bis(4-amino-3-methylcyclohexyl)methane, aliphatic diamine such as tetramethylenediamine and hexamethylenediamine, or the like.

In the present exemplary embodiment, the liquid crystal photoalignment agent may include a repeating unit represented by the following Chemical Formulas C or D.

Chemical Formula C

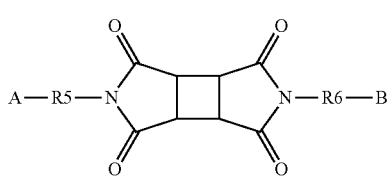

Unit 1

-continued

Chemical Formula D

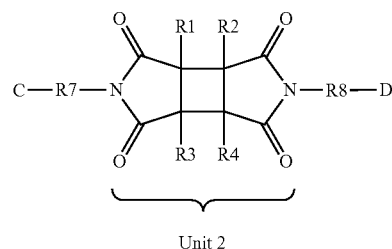

Unit 2

In Chemical Formulas C and D, R5, R6, R7, and R8 each correspond to a group bonded to amines of two adjacent diamines, and A, B, C, and D are each unit 1 or unit 2. In Chemical Formula D, R1, R2, R3, and R4 are each independently hydrogen, fluorine, or an organic compound, and at least one of R1, R2, R3, and R4 may not be hydrogen.

The diamine may be any one of compounds represented by the following Chemical Formulas F, G, and H. In Chemical Formula G, X may be —S—, —CO—, —NH—, or an alkylene group, and in Chemical Formula H, X may be an alkyl group.

Chemical Formula F

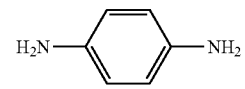

Chemical Formula G

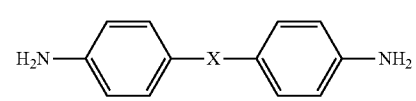

Chemical Formula H

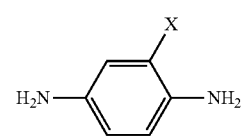

Hereinafter, a method of forming the alignment layer will be described. The photoalignment agent formed by polymerizing at least one of cyclobutane dianhydride (CBDA) and the cyclobutane dianhydride (CBDA) derivative is applied on the pixel electrode 191. Thereafter, the applied photoalignment agent is baked. A baking step may be performed through a prebaking and a hard baking.

Thereafter, the first alignment layer 11 may be formed by radiating polarized light on the photoalignment agent. In this case, as radiated light, ultraviolet light having a range of 240 nanometers to 380 may be used. In some embodiments, ultraviolet light of 254 nanometers may be used. The first alignment layer 11 may be baked once more in order to increase an alignment property. In the present exemplary embodiment, decomposition efficiency representing a change in imidization ratio included before and after exposure of the first alignment layer 11 is in a range of 10% to and 30%.

Hereinafter, a range of decomposition efficiency representing the change in imidization ratio included before and after exposure of the alignment layer will be described with reference to FIGS. 3 to 12.

Figure 3:
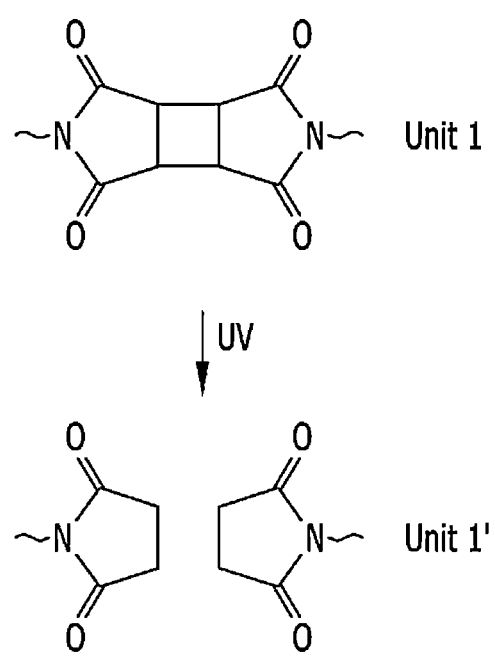
FIG. 3 is a Structural Formula illustrating decomposition of polyimide in an alignment layer according to the exemplary embodiment of the present invention.
Figure 4:
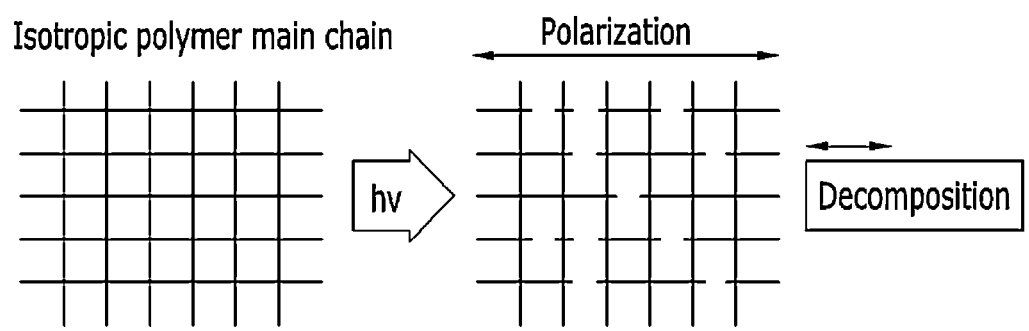
FIG. 4 is a view illustrating a change process from isotropy to anisotropy in the alignment layer according to the exemplary embodiment of the present invention.

FIG. 3 is a Structural Formula illustrating the decomposition of polyimide in the alignment layer according to exemplary embodiments of the present invention. FIG. 4 is a view illustrating a change process from isotropy to anisotropy in the alignment layer according to exemplary embodiments of the present invention.

Referring to FIG. 3, cyclobutane dianhydride (CBDA) and a diamine are subjected to the polymerization reaction through a baking process to form a polyimide (unit 1), and UV is radiated on polyimide to form maleimide (unit 1').

FIG. 4 illustrates that a polymer main chain including polyimide (unit 1) illustrated in FIG. 3 is decomposed to be aligned according to radiation of polarized UV. Referring to FIG. 4, if polarized UV is radiated on an isotropic polymer main chain, photodecomposition occurs in a polarization direction (absorption axis direction). Thus, a photoalignment layer may be aligned in a direction that is vertical to the polarization direction. Herein, if an exposure amount is excessively small, decomposition efficiency is low, and the alignment property may deteriorate. On the contrary, if the exposure amount is excessively increased, decomposition efficiency is increased, and decomposition occurs in other direction(s) in addition to the polarization direction. Thus, the alignment property may be reduced. Accordingly, the range of decomposition efficiency according to the exposure amount should be set in order to improve the alignment property.

Figure 5:
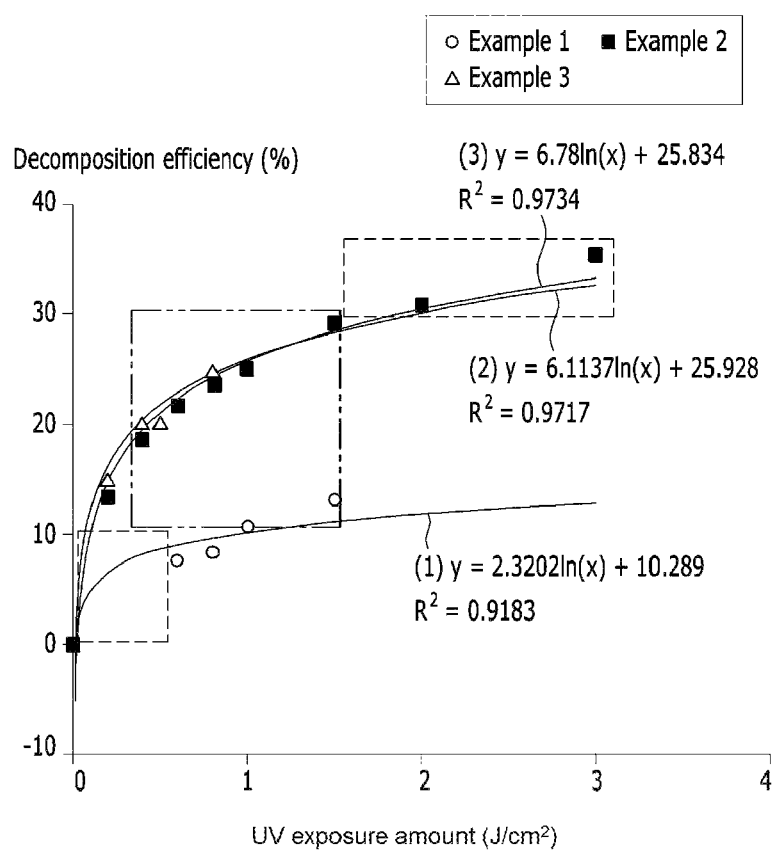
FIG. 5 is a graph illustrating decomposition efficiency according to an exposure amount of the alignment layer according to the exemplary embodiment of the present invention.

FIG. 5 is a graph illustrating decomposition efficiency according to an exposure amount of the alignment layer according to exemplary embodiments of the present invention. FIG. 5 illustrates Examples 1, 2, and 3 of the present invention, which include alignment layers having different materials.

Example 1 is an alignment layer formed by polymerizing CBDA represented by the following Chemical Formula A and a compound represented by the following Chemical Formula F, which is a kind of rigid diamine. Example 2 is an alignment layer formed by polymerizing the CBDA derivative represented by the following Chemical Formula B and a compound represented by the following Chemical Formula F, which is a kind of rigid diamine. Example 3 is an alignment layer formed by polymerizing the CBDA derivative represented by the following Chemical Formula B and a compound represented by the following Chemical Formula G, which is a kind of flexible diamine.

Chemical Formula A

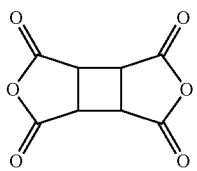

Chemical Formula B

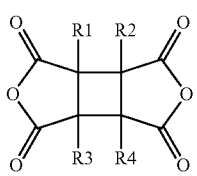

Chemical Formula F

Chemical Formula G

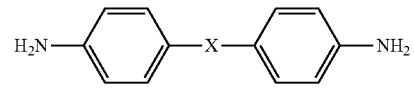

In Chemical Formula G, X may be an alkylene group, —S—, —CO—, or —NH—.

If decomposition efficiency of the photo-decompositional alignment layer is more than 30%, the molecular weight may be reduced and anisotropy and reliability may be reduced. If decomposition efficiency of the photo-decompositional alignment layer is less than 10%, photodecomposition is insufficient, and alignment reduction may occur. Accordingly, the anisotropy of the first alignment layer 11 included in the liquid crystal display may be improved by limiting the decomposition efficiency thereof.

Figure 14:
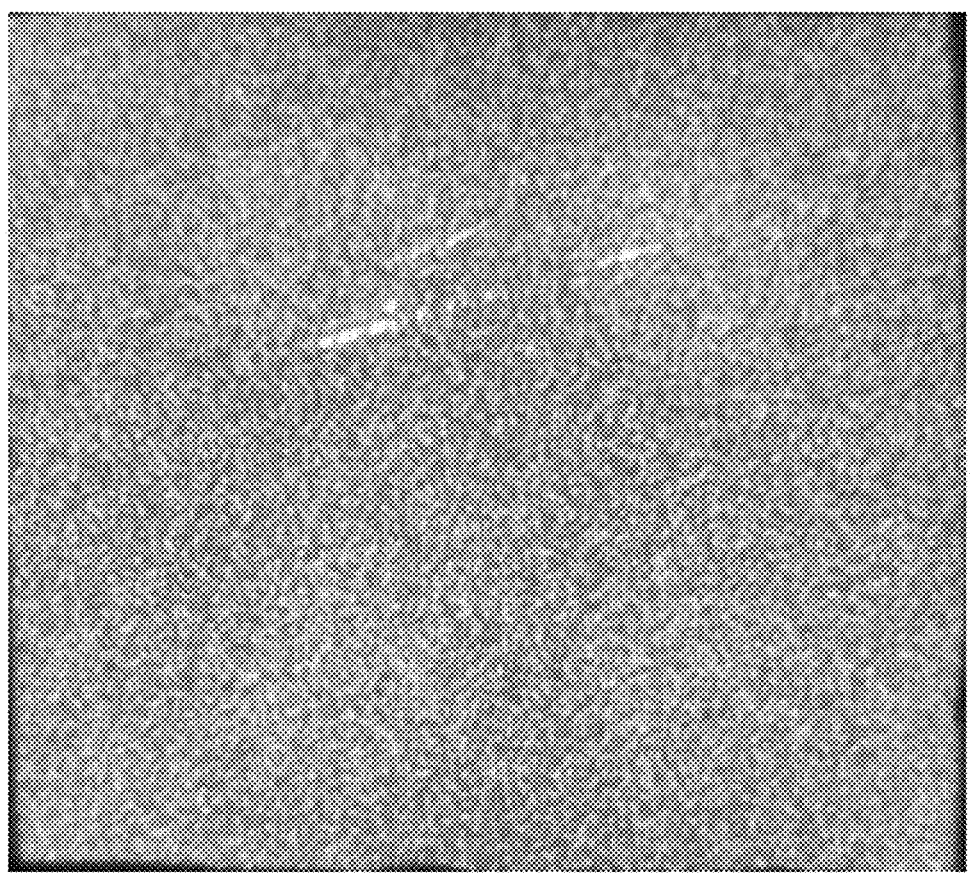
FIG. 14 is a picture illustrating alignment inferiority in the case where the alignment layer having decomposition efficiency of 8% is formed.

FIG. 14 is a picture illustrating alignment inferiority in the case where the alignment layer having a decomposition efficiency of 8% is formed. Referring to FIG. 14, the alignment layer having decomposition efficiency of 8% is formed by a light radiation energy of 0.6 J/cm$^2$, and the occurrence of alignment inferiority is illustrated.

Figure 6:
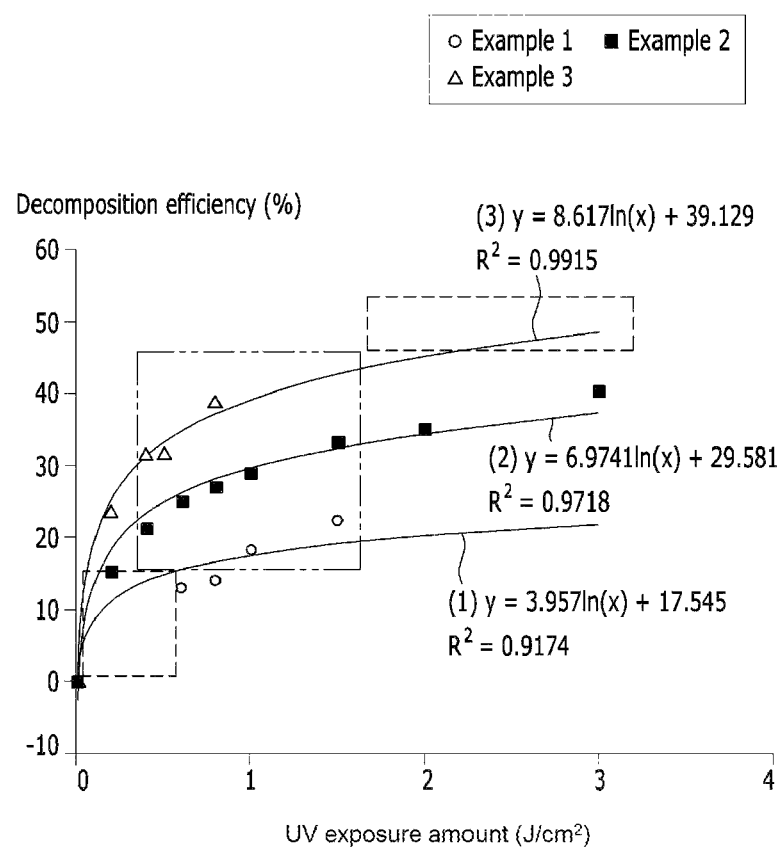
FIG. 6 is a graph illustrating normalization of decomposition efficiency according to the exposure amount of the alignment layer according to the exemplary embodiment of the present invention.

FIG. 6 is a graph illustrating normalization of decomposition efficiency according to the exposure amount of the alignment layers according to exemplary embodiments of the present invention. FIG. 6 illustrates a result obtained by converting a result of FIG. 5 by (decomposition efficiency/X)*100, to measure the decomposition efficiency/unit when the imidization ratio before exposure is X %.

Since polyamic acid may exist as a precursor of polyimide in addition to polyimide before exposure and may be decomposed by polarized light exposure, the decomposition efficiency of the polyamic acid may be added to the decomposition efficiency/unit. In other words, when polyimide exists in an amount of X % before exposure, and the polyamic acid exists in an amount of (100–X) %. Thus, the imidization ratio before exposure may be X %.

A decomposition efficiency/unit according to exemplary embodiments of the present invention may satisfy the following Equation 1.

$$1000/X(\%) \leq \text{decomposition efficiency/unit} \leq 3000/X(\%) \quad \text{Equation 1}$$

In this case, decomposition efficiency/unit may be in a range of 15% to 45%.

Figure 7:
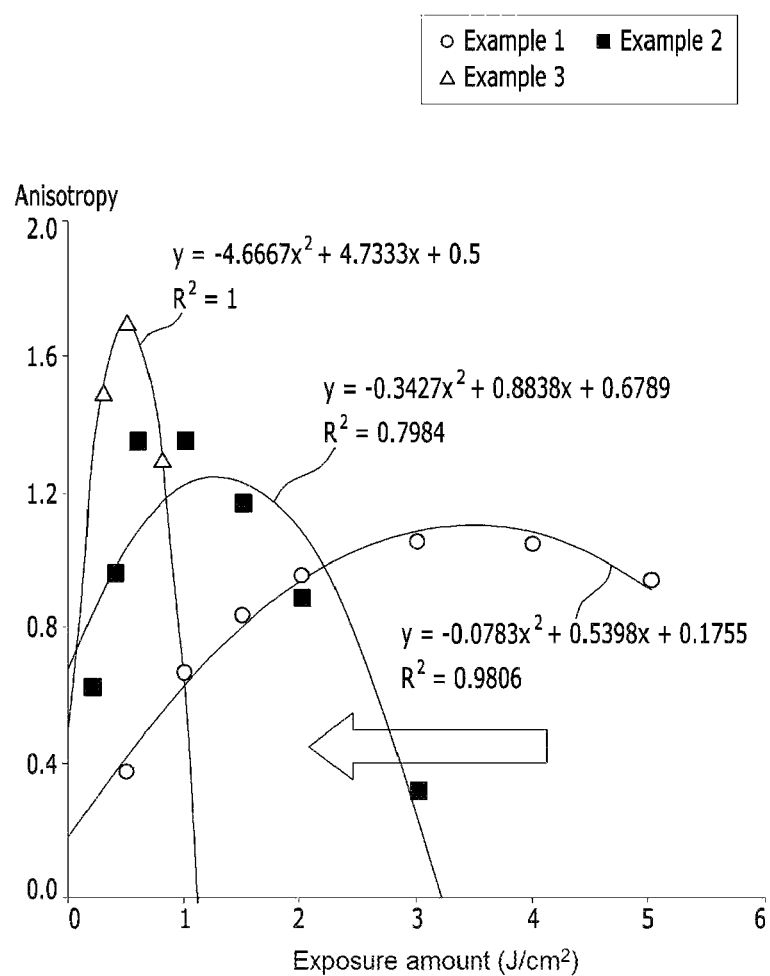
FIG. 7 is a graph illustrating a relationship between the exposure amount and anisotropy according to a material of the alignment layer in the exemplary embodiment of the present invention.

FIG. 7 is a graph illustrating a relationship between the exposure amount and anisotropy according to the material of the alignment layers in exemplary embodiments of the present invention. FIG. 7 illustrates that there is a difference in anisotropy and exposure sensitivity according to the materials of Examples 1, 2, and 3. However, referring to FIGS. 8 to 10, as will be described later, it can be confirmed that a proportional relationship comes into existence between an afterimage and alignment force.

Figure 8:
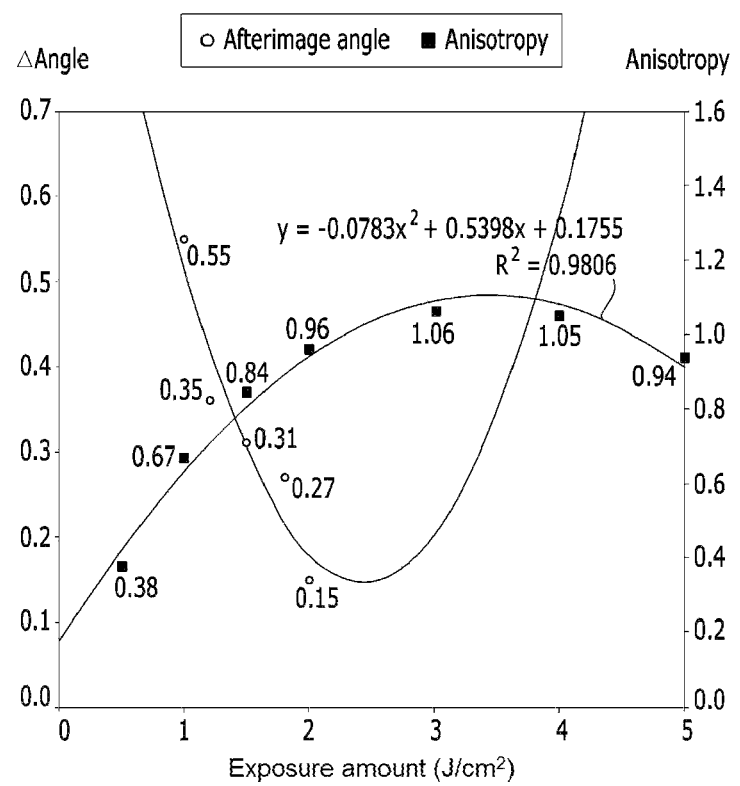
FIGS. 8, 9, and 10 are graphs illustrating an afterimage angle and anisotropy according to the exposure amount in Examples 1, 2, and 3 of the present invention.
Figure 9:
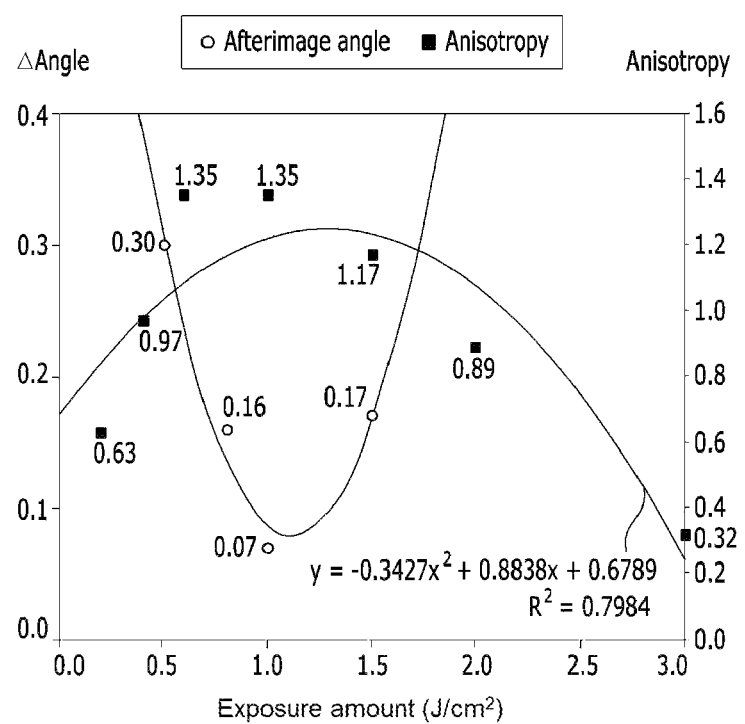
Figure 10:
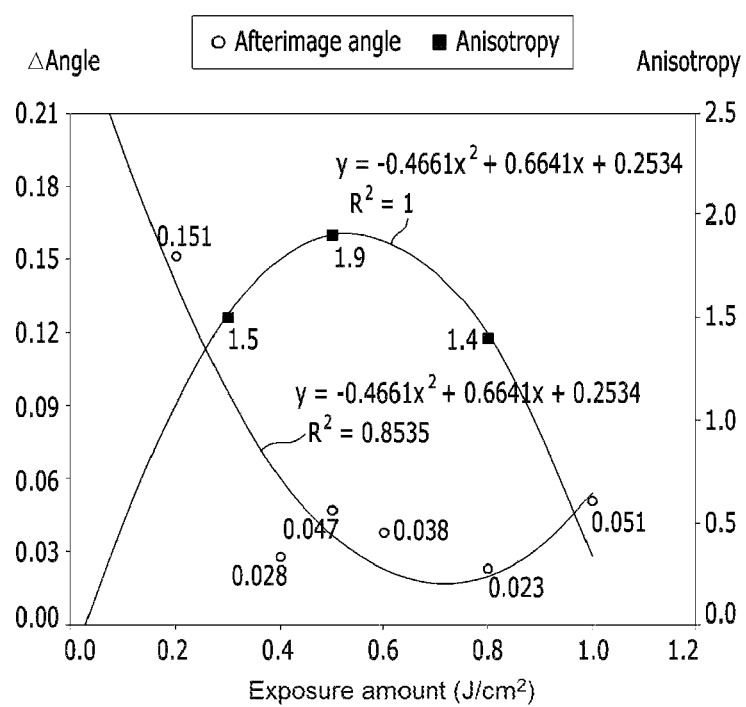

FIGS. 8 to 10 are graphs illustrating an afterimage angle and anisotropy according to the exposure amounts in Examples 1, 2, and 3. Referring to FIGS. 8 to 10, differences in afterimage angle (Δangle) and anisotropy occur according to the exposure amount. Since the materials of the alignment layers are different from each other in Examples 1, 2, and 3, exposure sensitivities are different from each other. However, a proportional relationship exists between the afterimage and alignment force (anisotropy). In other words, since there is a relationship where alignment force is increased if the afterimage is improved (if the afterimage angle is reduced). Thus, a value satisfying an afterimage condition and an alignment condition may be calculated.

For example, referring to FIGS. 5 and 10, a decomposition efficiency satisfying the afterimage angle of 0.12° or less may be approximately 15% to 25%. This range is included in a decomposition efficiency range of 10% to 30%, which is a range where alignment reduction as described above does not occur.

Figure 11:
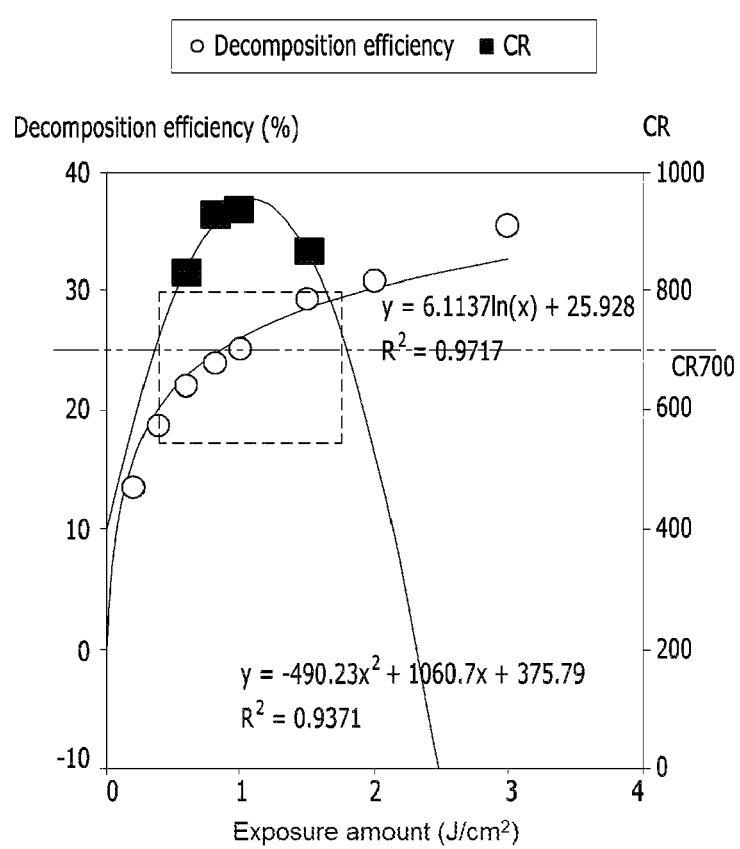
FIG. 11 is a graph illustrating a contrast ratio (CR) and decomposition efficiency according to the exposure amount in Example 2 of the present invention.

FIG. 11 is a graph illustrating a contrast ratio (CR) and decomposition efficiency according to the exposure amount in Example 2. Referring to FIG. 11, a contrast ratio (CR) of 700 or more may be secured in the decomposition efficiency range of 20% to 30%.

Figure 12:
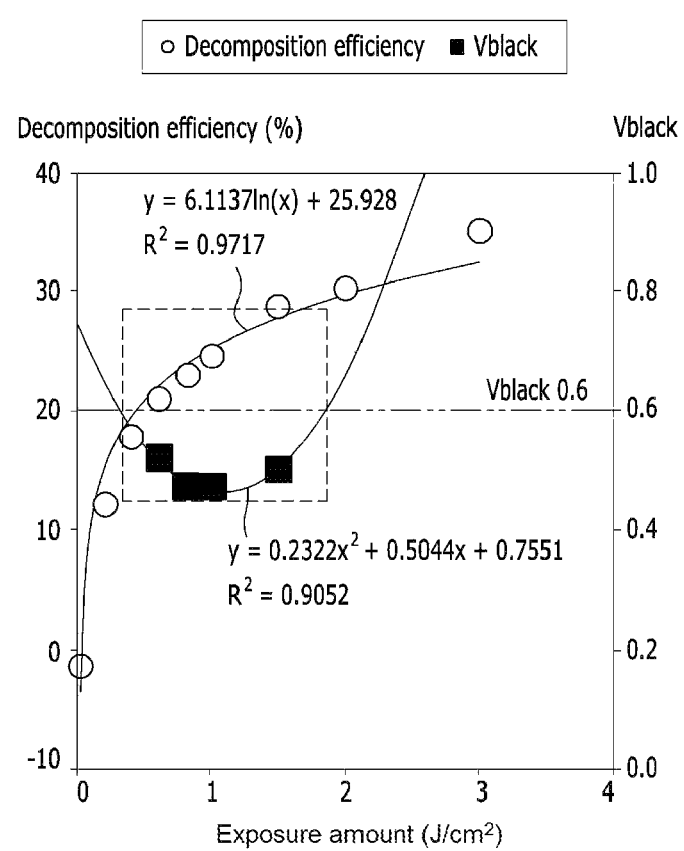
FIG. 12 is a graph illustrating a voltage in a black state and decomposition efficiency according to the exposure amount in Example 2 of the present invention.

FIG. 12 is a graph illustrating a voltage in a black state and decomposition efficiency according to the exposure amount in Example 2. Referring to FIG. 12, the voltage in the black state (Vblack) of 0.6 V or less may be secured in the decomposition efficiency range of approximately 20% to 28%.

As described above, the decomposition efficiency range of 10% to 30%, in which alignment reduction does not occur, further includes a range where characteristics such as the afterimage and the contrast ratio are improved.

FIG. 13 is a table illustrating a change in decomposition efficiency measured by an FT-IR analysis method in Example 1. Hereinafter, a method of measuring decomposition efficiency by the FT-IR (Fourier transform infrared spectrometer) analysis method will be described. In FIG. 13, the aforementioned Example 1 was tested as a sample.

Decomposition efficiency represents a difference between the imidization ratio before exposure and the imidization ratio after exposure. Specifically, in the following Chemical Formula E, a change in stretching peak of an imide ring occurs while a cyclobutane ring is decomposed and maleimide is formed to decrease the imidization ratio. The decrease is defined as decomposition efficiency. Decomposition efficiency/unit, as described in FIG. 6, represents a value obtained by performing conversion by (decomposition efficiency/X)*100, to perform measurement when the imidization ratio before exposure is X %.

Referring back to FIGS. 3 and 4, if the isotropic polymer main chain is decomposed in the polarization direction, the cyclobutane ring is broken. In this case, a change in characteristic peak of an imide group occurs due to breakage of the cyclobutane ring. The change in characteristic peak is measured according to the exposure amount and represented by the table in FIG. 13. Specifically, the table of FIG. 13 may be calculated by the following Equation 2 (T is a curing temperature of 230° C.) in consideration of a reference value imidized by 100% at the curing temperature of 300° C. In other words, the imidization ratio ($R_{imide\ ratio}$) may be obtained by using a change in absorption intensity (A1380) of a C—N bond of the imide ring (wave number of 1380 cm$^{-1}$ or 1383 cm$^{-1}$) to absorption intensity (A1500) of the bond converted to a C=C bond of a benzene ring (wave number of 1500 cm$^{-1}$) in the following Chemical Formula E. Decomposition efficiency may be calculated through the calculated change in imidization ratio. The table illustrated in FIG. 13 is an example illustrating a method of obtaining decomposition efficiency.

$$R_{imide\ ratio}(\%) = \frac{\left(\frac{A_{1380}}{A_{1500}}\right)T}{\left(\frac{A_{1380}}{A_{1500}}\right)300°\ C.} \times 100(\%) \quad \text{Equation 2}$$

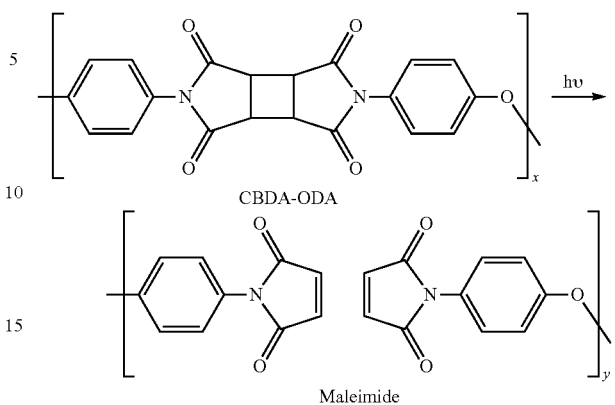

Chemical Formula E

CBDA-ODA

Maleimide

Then, referring back to FIGS. 1 and 2, the upper display panel 200 will be described. A light blocking member 220 is formed on a second substrate 210 made of transparent glass, plastic, or the like. The light blocking member 220 is called a black matrix and prevents light leakage.

Further, a plurality of color filters 230 are formed on the second substrate 210. In the case where the second passivation layer 180b of the lower display panel 100 is the color filter, the color filter 230 of the upper display panel 200 may be omitted. Further, the light blocking member 220 of the upper display panel 200 may be formed in the lower display panel 100.

An overcoat 250 is formed on the color filter 230 and the light blocking member 220. The overcoat 250 may be made of an (organic) insulator, and prevents exposure of the color filter 230 and provides a flat surface. The overcoat 250 may be omitted in some embodiments.

A second alignment layer 21 is formed on the overcoat 250. The second alignment layer 21 includes a photo-reactive material. The second alignment layer 21 may be formed of the same material as the first alignment layer 11 and by the same method as described above for the first alignment layer 11.

The liquid crystal layer 3 may include a liquid crystal material having a positive dielectric anisotropy. Liquid crystal molecules of the liquid crystal layer 3 are arranged so that a long axis direction thereof is parallel to the display panels 100 and 200, when a voltage is not applied.

The pixel electrode 191 receives a data voltage from the drain electrode 175, and the common electrode 270 receives a common voltage from a common voltage applying unit disposed in the outside of the display region.

The liquid crystal molecules of the liquid crystal layer 3 disposed on the two field generating electrodes 191 and 270 are rotated in a direction that is parallel to a direction of the electric field generated by the pixel electrode 191 and the common electrode 270. As described above, polarization of light passing through the liquid crystal layer is changed according to the determined rotation direction of the liquid crystal molecules. The transmittance of the liquid crystal display may be increased and a wide viewing angle may be implemented by forming the two field generating electrodes 191 and 270 on one display panel 100.

The common electrode 270 has a planar shape and the pixel electrode 191 has a plurality of branch electrodes. However, the pixel electrode 191 may have the planar shape and the common electrode 270 may have the plurality of branch electrodes.

The present invention can be applied to all other cases where the two field generating electrodes overlap with each other on the first substrate 110, while the insulating layer is interposed therebetween. The first field generating electrode formed beneath the insulating layer has a planar shape, and the second field generating electrode formed on the insulating layer has the plurality of branch electrodes.

A condition of the photoalignment layer according to the exemplary embodiment of the present invention is set for a device using a PLS (plane-to-line switching) mode like the liquid crystal display described in FIGS. 1 and 2. However, aspects of the present invention can be applied to a coplanar electrode (CE) mode such as an IPS (in-plane switching) mode.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A liquid crystal display, comprising:
a first substrate;
a thin film transistor disposed on the first substrate;
a first electrode connected to the thin film transistor; and
a first alignment layer disposed on the first electrode,
wherein the first alignment layer is formed by polymerizing a diamine represented by Chemical Formula G and a cyclobutane dianhydride (CBDA) derivative represented by Chemical Formula B, and
a decomposition degree representing a change in an imidization ratio of the first alignment layer before and after exposure of the first alignment layer to light having an irradiation enemy less than about 2.0 J/cm$^2$ is in a range of 10% to 30%,
wherein Chemical Formula B is as follows:

(Chemical Formula B)

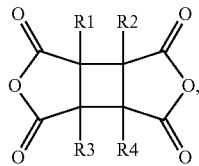

wherein in Chemical Formula B, R1, R2, R3, and R4 are each independently hydrogen, fluorine, or an organic group, and at least one of R1, R2, R3, and R4 is not hydrogen,
wherein Chemical Formula G and Chemical Formula H are as follows:

(Chemical Formula G)

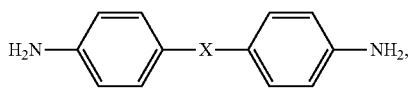

(Chemical Formula H)

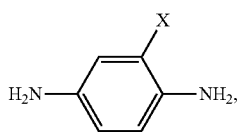

wherein in Chemical Formula G, X is an alkylene group, —S—, —CO— or —NH—, and
wherein in Chemical Formula H, X is an alkyl group.

2. The liquid crystal display of claim 1, wherein:
the first alignment layer comprises a repeating unit represented by the following Chemical Formula D:

(Chemical Formula D)

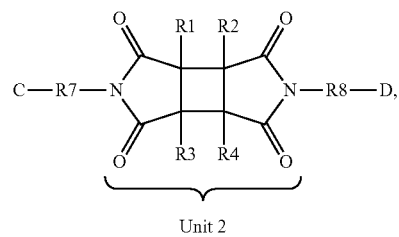

Unit 2 wherein,
in Chemical Formula D, R7 and R8 are each organic groups bonded to two amines, and C and D are each unit 2, and
in Chemical Formula D, R1, R2, R3, and R4 are each independently hydrogen, fluorine, or an organic group, and at least one of R1, R2, R3, and R4 is not hydrogen.

3. The liquid crystal display of claim 2, further comprising:
a second electrode disposed on the first substrate; and
an insulating layer disposed between the first electrode and the second electrode;
wherein the first electrode comprises branch electrodes, and the second electrode has a planar shape.

4. The liquid crystal display of claim 3, wherein the branch electrodes overlap with the second electrode.

5. The liquid crystal display of claim 4, further comprising a passivation layer disposed between the thin film transistor and the second electrode,
wherein the thin film transistor and the first electrode are connected through a contact hole formed in the passivation layer and the insulating layer.

6. The liquid crystal display of claim 1, further comprising:
a second substrate facing the first substrate;
a second alignment layer disposed on the second substrate; and
a liquid crystal layer disposed between the first substrate and the second substrate,
wherein the second alignment layer is formed of the same material as the first alignment layer.

7. A liquid crystal display comprising:
a first substrate;
a thin film transistor disposed on the first substrate;
a first electrode connected to the thin film transistor; and
a first alignment layer disposed on the first electrode,
the first alignment layer is formed by polymerizing a diamine represented by Chemical Formula G with a cyclobutane dianhydride (CBDA) derivative represented by Chemical Formula B, Chemical Formula G is as follows:

(Chemical Formula G)

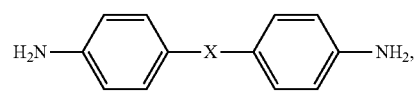

wherein a decomposition degree of the first alignment layer with respect to radiated light having an irradiation enemy less than about 2.0 J/cm² satisfies the following Equation 1:

$$1000/X(\%) \leq \text{decomposition degree/unit} \leq 3000/X(\%) \quad \text{(Equation 1)},$$

wherein in Equation 1, X is an imidization ratio before exposure of the first alignment layer to the light,
wherein Chemical Formula B is as follows:

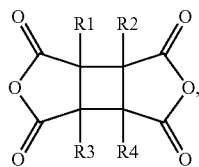

(Chemical Formula B)

wherein in Chemical Formula B, R1, R2, R3, and R4 are each independently hydrogen, fluorine, or an organic group, and at least one of R1, R2, R3, and R4 is not hydrogen,
wherein X of Chemical Formula G is an alkylene group.

8. The liquid crystal display of claim 7, wherein the decomposition degree/unit is in a range of 15% to 45%.

9. The liquid crystal display of claim 8, wherein the first alignment layer comprises a repeating unit represented by the following Chemical Formula D:

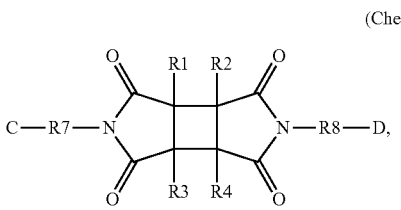

(Chemical Formula D)

Unit 2 wherein,
in Chemical Formula D, R7 and R8 are each organic groups bonded to two amines, and C and D are each unit 2, and
in Chemical Formula D, R1, R2, R3, and R4 are each independently hydrogen, fluorine, or an organic group, and at least one of R1, R2, R3, and R4 is not hydrogen.

* * * * *